United States Patent
Wu et al.

(10) Patent No.: US 8,193,895 B2
(45) Date of Patent: Jun. 5, 2012

(54) MAGNETIC ASSEMBLY AND FABRICATING METHOD THEREOF

(75) Inventors: Tsung-Hsiao Wu, Taoyuan Hsien (TW); Ching-Hsien Teng, Taoyuan Hsien (TW); Kao-Tsai Liao, Taoyuan Hsien (TW); Zhi-Liang Zhang, Taoyuan Hsien (TW); Tian-Chang Lin, Taoyuan Hsien (TW); Ming Yeh, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 72 days.

(21) Appl. No.: 12/827,205

(22) Filed: Jun. 30, 2010

(65) Prior Publication Data

US 2011/0001590 A1    Jan. 6, 2011

(30) Foreign Application Priority Data

Jul. 1, 2009   (TW) ................................ 98122326 A

(51) Int. Cl.
*H01F 27/30* (2006.01)
*H01F 5/00* (2006.01)
*H01F 7/06* (2006.01)

(52) U.S. Cl. ........ 336/200; 336/229; 336/206; 29/602.1

(58) Field of Classification Search ............. 336/229, 336/206, 222, 223, 232, 200
See application file for complete search history.

(56) References Cited

U.S. PATENT DOCUMENTS

| | | | |
|---|---|---|---|
| 4,536,733 A * | 8/1985 | Shelly | 336/182 |
| 5,425,166 A * | 6/1995 | Hastings et al. | 29/602.1 |
| 7,158,005 B2 * | 1/2007 | Pleskach et al. | 336/229 |
| 7,280,027 B2 * | 10/2007 | Feth et al. | 336/229 |
| 7,400,224 B2 * | 7/2008 | Feist | 336/229 |

* cited by examiner

*Primary Examiner* — Anh Mai
(74) *Attorney, Agent, or Firm* — Kirton McConkie; Evan R. Witt

(57) ABSTRACT

A magnetic assembly includes a magnetic core, a circuit board and multiple conductive elements. The circuit board includes multiple conductive regions. The conductive elements stride over the magnetic core. Each of the conductive elements includes a first terminal, a second terminal and a connecting part. The connecting part is arranged between the first terminal and the second terminal for connecting the first terminal with the second terminal. The first terminal and the second terminal of each conductive element are respectively connected to two adjacent conductive regions. The multiple conductive elements and the multiple conductive regions collectively define multiple loops. The multiple loops interact with the magnetic core to generate inductance.

13 Claims, 8 Drawing Sheets

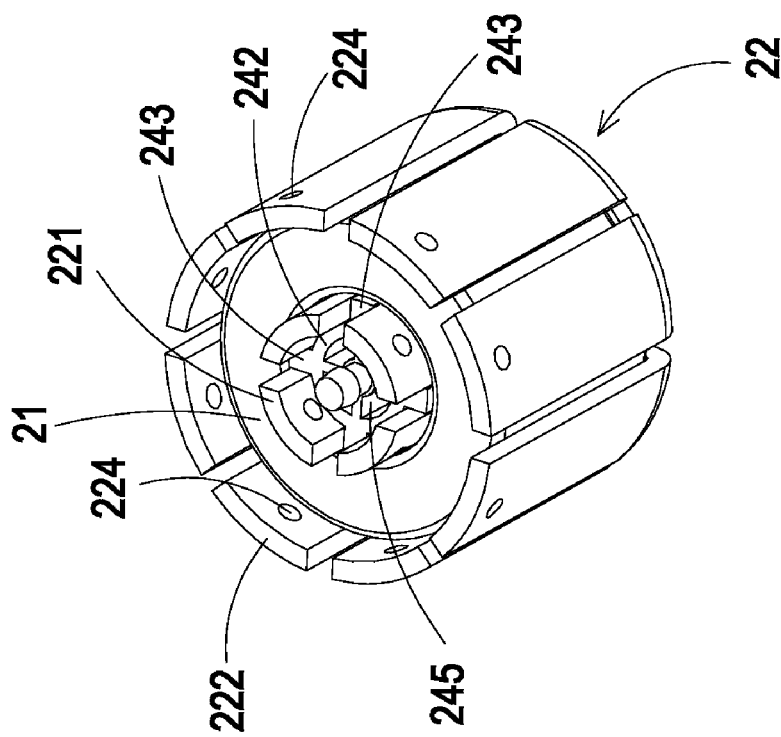
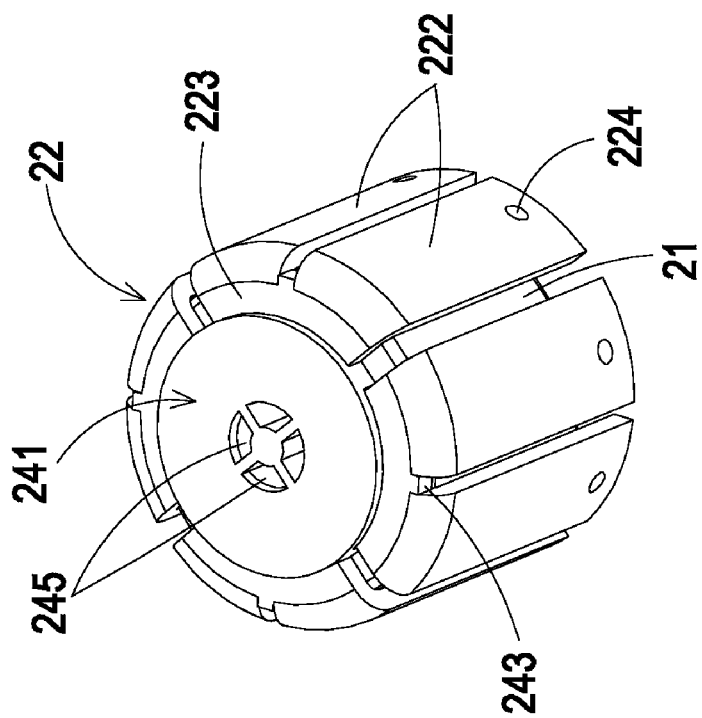
FIG. 5B
FIG. 5A

MAGNETIC ASSEMBLY AND FABRICATING METHOD THEREOF

FIELD OF THE INVENTION

The present invention relates to a magnetic assembly, and more particularly to a magnetic assembly with enhanced inductance amount. The present invention also relates to a method of fabricating such a magnetic assembly.

BACKGROUND OF THE INVENTION

An electronic device usually has many electronic components to collectively define an electrical circuit. Due to electromagnetic conduction or electromagnetic radiation emitted from an external source, the electronic components or the electrical circuit is readily suffered from an electromagnetic interference (EMI) problem. The EMI problem is detrimental to the electronic components and the electrical circuit. If the EMI problem is serious, the electronic device or the neighboring devices may have a breakdown or damage. For minimizing the influence of the EMI problem, the electronic device usually has a choke.

FIG. 1 is a schematic perspective view illustrating a conventional choke. As shown in FIG. 1, the conventional choke 1 comprises a ring-shaped core 11 and multiple wires 12. After the terminals 121 of the wires 12 are arranged in parallel, the wires 12 are collectively wound around the ring-shaped core 11. Then, the terminals 121 of the wires 12 are inserted into corresponding insertion holes 131 of the printed circuit board 13. Then, the junctions between the terminals 121 and the insertion holes 131 are coated with solder paste (not shown), so that the choke 1 is firmly fixed on the printed circuit board 13. Under this circumstance, the wires 12 interact with the ring-shaped core 11 to generate inductance.

Since the wires 12 are arranged in parallel and wound around the ring-shaped core 11, the number of wires 12 will be limited. For example, as shown in FIG. 1, only six wires 12 are arranged in parallel and wound around the ring-shaped core 11 for three turns. As known, the inductance amount generated by the choke 1 is usually in direct proportion to the turns of the wires 12. If the turns of the wires 12 fail to be increased, the inductance amount is usually insufficient to meet the practical requirements. The process of winding several wires 12 around the ring-shaped core 11 is complicated, time-consuming and labor-intensive.

Therefore, there is a need of providing a magnetic assembly so as to obviate the drawbacks encountered from the prior art.

SUMMARY OF THE INVENTION

It is an object of the present invention to provide a magnetic assembly and a method of fabricating such a magnetic assembly, thereby simplifying the process and reduce the cost and fabricating time.

In accordance with an aspect of the present invention, there is provided a magnetic assembly. The magnetic assembly includes a magnetic core, a circuit board and multiple conductive elements. The circuit board includes multiple conductive regions. The conductive elements stride over the magnetic core. Each of the conductive elements includes a first terminal, a second terminal and a connecting part. The connecting part is arranged between the first terminal and the second terminal for connecting the first terminal with the second terminal. The first terminal and the second terminal of each conductive element are respectively connected to two adjacent conductive regions. The multiple conductive elements and the multiple conductive regions collectively define multiple loops.

In accordance with another aspect of the present invention, there is provided a method of fabricating a magnetic assembly. The method includes steps of: (a) providing a magnetic core; (b) providing multiple conductive elements striding over the magnetic core, wherein each of the conductive elements includes a first terminal, a second terminal and a connecting part, and the connecting part is arranged between the first terminal and the second terminal for connecting the first terminal with the second terminal; and (c) respectively connecting the first terminal and the second terminal of each conductive element with two adjacent conductive regions of a circuit board, so that the multiple conductive elements and the multiple conductive regions collectively define multiple loops.

The above contents of the present invention will become more readily apparent to those ordinarily skilled in the art after reviewing the following detailed description and accompanying drawings, in which:

BRIEF DESCRIPTION OF THE DRAWINGS

FIG. 5A is a schematic assembled view illustrating the magnetic assembly of FIG. 2;

FIG. 5B is a schematic assembled view illustrating the magnetic assembly of FIG. 2 and taken from a different viewpoint;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
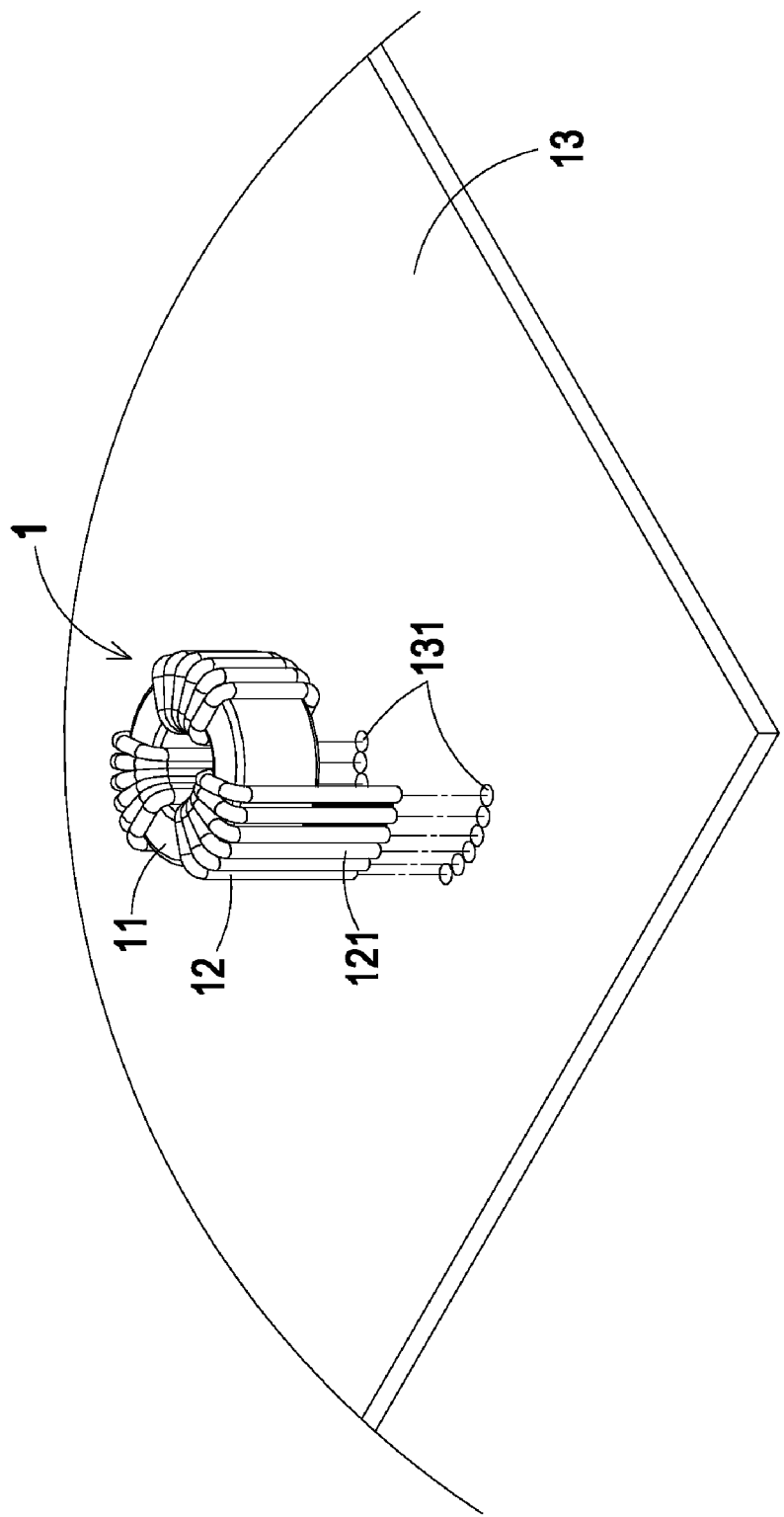
FIG. 1 is a schematic perspective view illustrating a conventional choke.
Figure 2:
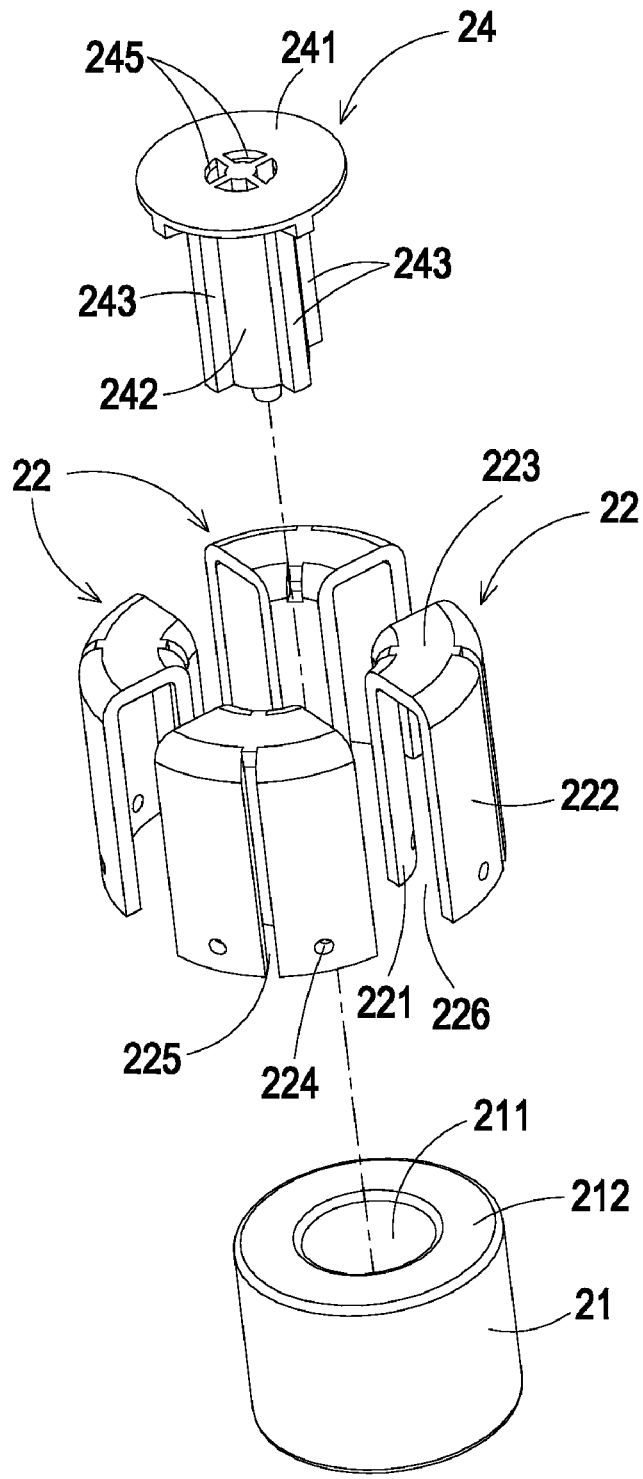
FIG. 2 is a schematic exploded view illustrating a portion of a magnetic assembly according to an embodiment of the present invention.
Figure 6A:
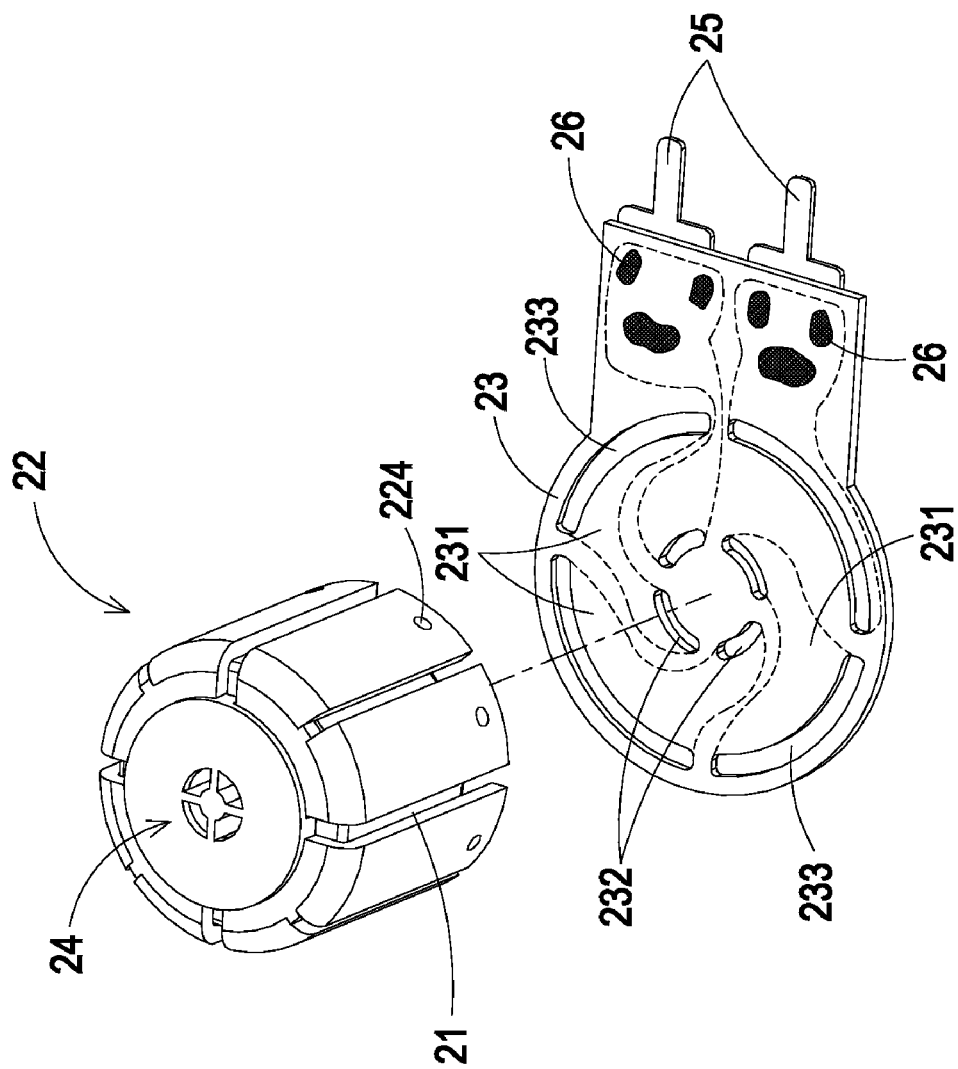
FIG. 6A is a schematic exploded view illustrating the complete structure of the magnetic assembly of the present invention.
Figure 6B:
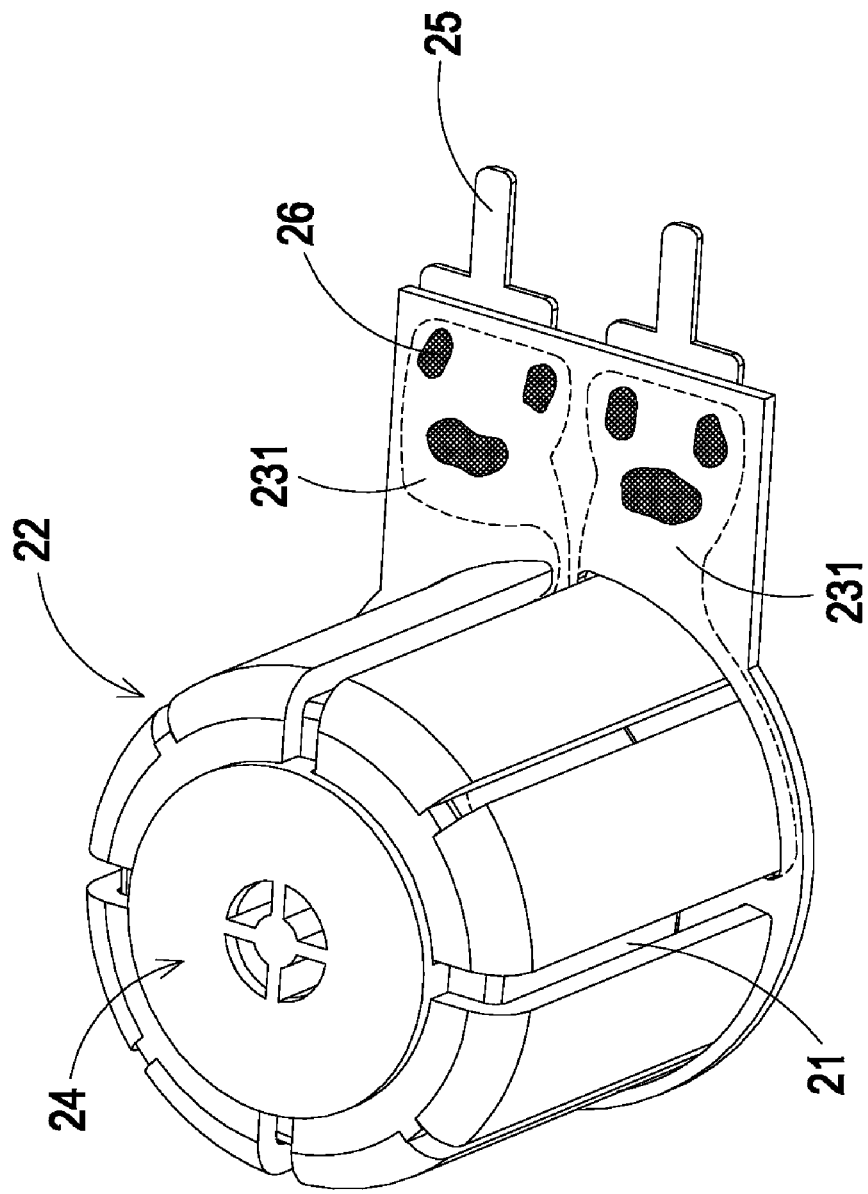
FIG. 6B is a schematic assembled view illustrating the complete structure of the magnetic assembly of the present invention.

FIG. 2 is a schematic exploded view illustrating a portion of a magnetic assembly according to an embodiment of the present invention. FIG. 6A is a schematic exploded view illustrating the complete structure of the magnetic assembly of the present invention. FIG. 6B is a schematic assembled view illustrating the complete structure of the magnetic assembly of the present invention. Please refer to FIGS. 2, 6A and 6B. The magnetic assembly 2 comprises a magnetic core 21, multiple conductive elements 22 and a circuit board 23. The circuit board 23 comprises multiple conductive regions 231. Each of the conductive elements 22 comprises a first terminal 221, a second terminal 222 and a connecting part 223. The connecting part 223 is arranged between the first terminal 221 and the second terminal 222 for connecting the first terminal 221 with the second terminal 222. The conductive elements 22 stride over the magnetic core 21. The first terminal 221 and the second terminal 222 of each conductive element 22 are respectively connected to two adjacent conductive regions 231 (see FIGS. 6A and 6B). As such, the multiple conductive elements 22 and the multiple conductive regions 231 collectively define multiple loops, which interact with the magnetic core 21 to generate inductance.

Figure 3:
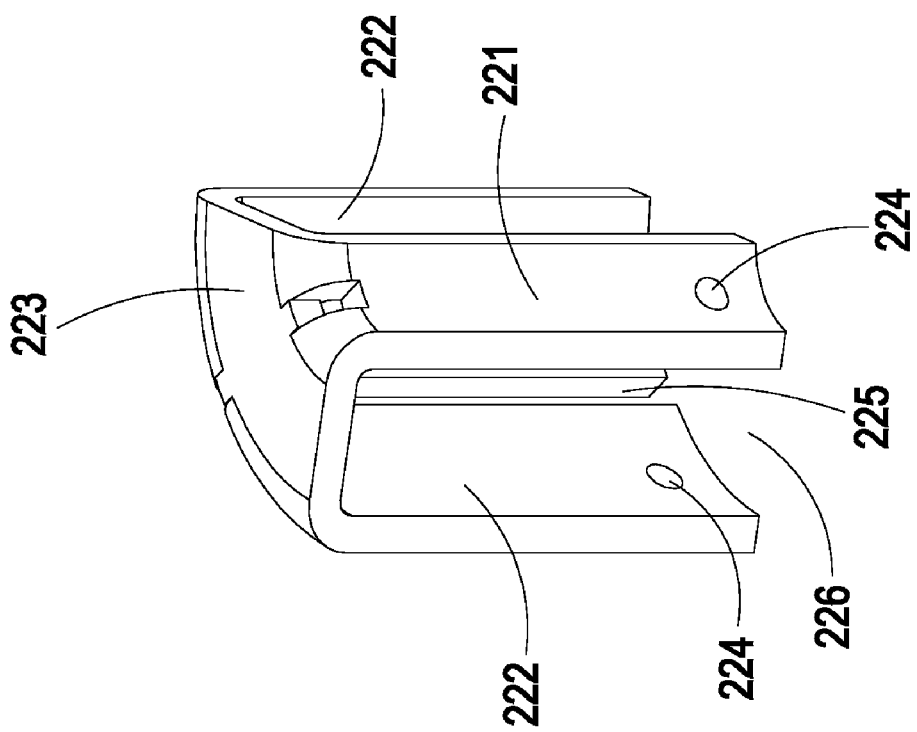
FIG. 3 is a schematic perspective view illustrating a conductive element used in the magnetic assembly of FIG. 2.

FIG. 3 is a schematic perspective view illustrating a conductive element used in the magnetic assembly of FIG. 2. Please refer to FIGS. 2 and 3. The magnetic core 21 has a central hollow portion 211. The connecting part 223 of the conductive element 22 is arranged between the first terminal 221 and the second terminal 222. The connecting part 223 is substantially perpendicular to the first terminal 221 and the second terminal 222. As such, a receptacle 226 is defined by the first terminal 221, the second terminal 222 and the connecting part 223. The magnetic core 21 is partially accommodated within the receptacle 226. In particular, the first terminal 221 of the conductive element 22 is inserted into the hollow portion 211 of the magnetic core 21, but the second terminal 222 of the conductive element 22 is disposed around the outer periphery of the magnetic core 21. The connecting part 223 is contacted with the upper edge 212 of the magnetic core 21.

Please refer to FIG. 6A again. In this embodiment, the circuit board 23 is a multi-layered printed circuit board. In other words, the multiple conductive regions 231 are buried within the circuit board 23. The conductive regions 231 comprise respective perforations 232 and 233. The first terminals 221 and the second terminals 222 of the conductive elements 22 are respectively inserted into corresponding perforations 232 and 233. For a specified conductive region 231, the first terminal 221 of a conductive element 22 is inserted into the perforation 232 of the specified conductive region 231 but the second terminal 222 of a neighboring conductive element 22 is inserted into the perforation 233 of the specified conductive region 231. As such, the first terminal 221 of a conductive element 22 is electrically connected with the neighboring conductive element 22 through the specified conductive region 231.

Please refer to FIG. 2 again. The magnetic assembly 2 further comprises an insulating element 24. The insulating element 24 is aligned with the hollow portion 211 of the magnetic core 21 and partially penetrates through the hollow portion 211 of the magnetic core 21. Moreover, the insulating element 24 is engaged with the first terminals 221 of the conductive elements 22, thereby facilitating fixing the conductive elements 22 on the magnetic core 21 (see FIG. 5B).

Figure 4B:
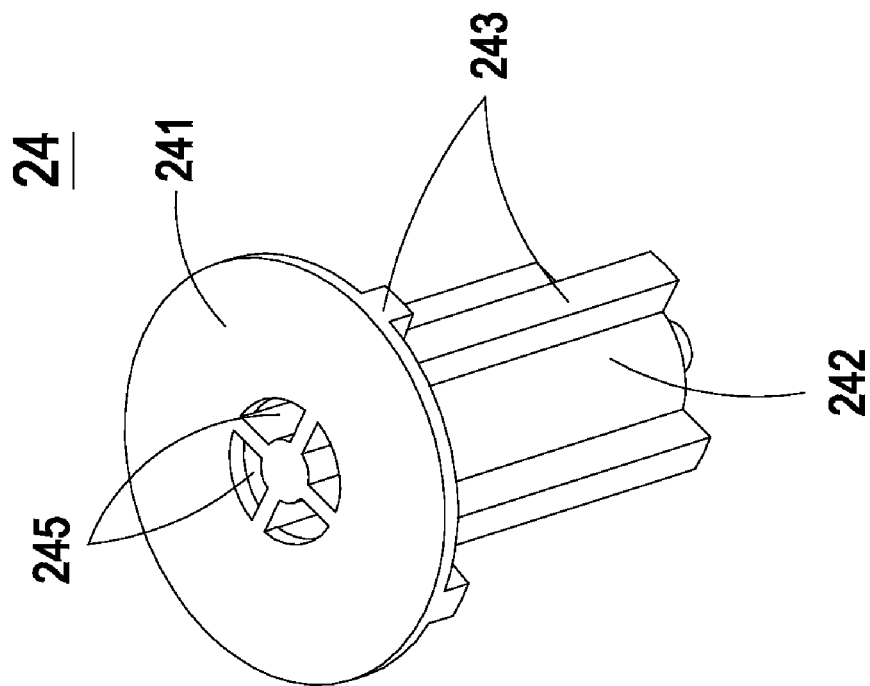
FIG. 4B is a schematic perspective view illustrating the insulating element of FIG. 4A and taken from a different viewpoint.
Figure 4A:
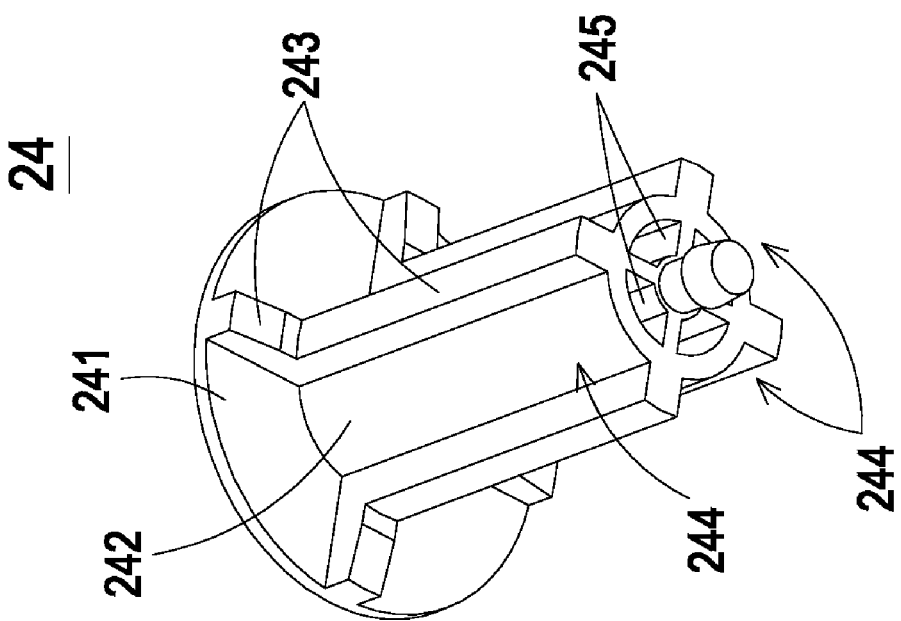
FIG. 4A is a schematic perspective view illustrating the insulating element used in the magnetic assembly of FIG. 2.

FIG. 4A is a schematic perspective view illustrating the insulating element used in the magnetic assembly of FIG. 2. FIG. 4B is a schematic perspective view illustrating the insulating element of FIG. 4A and taken from a different viewpoint. The insulating element 24 comprises a flat slab 241, a cylindrical body 242 and multiple ribs 243. The flat slab 241 and the cylindrical body 242 are perpendicular to each other. The cylindrical body 242 partially penetrates through the hollow portion 211 of the magnetic core 21 (see FIG. 5B). The flat slab 241, the cylindrical body 242 and the ribs 243 collectively define multiple insulating recesses 244. For each conductive element 22, the first terminal 221 and a portion of the connecting part 223 are accommodated within a corresponding insulating recess 244. As a consequence, every two adjacent conductive elements 22 are isolated by the ribs 243 of the insulating element 24 (see FIG. 5B). In addition, the insulating element 24 further comprises a channel 245, which runs through the flat slab 241 and the cylindrical body 242. The channel 245 is used for facilitating ventilation and heat-dissipation.

Please refer to FIGS. 2 and 3. In some embodiments, the second terminal 222 of the conductive element 22 further comprises a notch 225 for facilitating heat-dissipation. It is preferred that the conductive element 22 is produced by bending a metallic plate (e.g. a copper plate). The shape of the conductive element 22 mates with the magnetic core 21. For example, in a case that the magnetic core 21 is a ring-shaped magnetic core, the conductive element 22 is arc-shaped.

Please refer to FIGS. 3 and 6A. The first terminal 221 and the second terminal 222 of the conductive element 22 have openings 224. After the first terminal 221 and the second terminal 222 of the conductive element 22 are inserted into corresponding perforations 232 and 233 of the circuit board 23, the molten solder paste (not shown) could be filled into the perforations 232 and 233 of the circuit board 23 so as to facilitate fixing the first terminal 221 and the second terminal 222 into corresponding perforations 232 and 233.

Please refer to FIGS. 6A and 6B. The magnetic assembly 2 further comprises several pins 25. The pins 25 are fixed on and electrically connected with the inlet and outlet conductive regions 231 by solder paste 26. Via the pins 25, the magnetic assembly 2 could be inserted into a system board (not shown).

Hereinafter, a method of fabricating the magnetic assembly of the present invention will be illustrated with reference to the schematic views of FIGS. 2, 5A, 5B, 6A, 6B and a flowchart of FIG. 7. First of all, a magnetic core 21 is provided (Step S71). Next, multiple conductive elements 22 are provided, wherein each of the conductive elements 22 comprises a first terminal 221, a second terminal 222 and a connecting part 223, and the first terminals 221 and the second terminals 222 of the conductive elements 22 stride over the magnetic core 21 (Step S72). The first terminals 221 of the conductive elements 22 are inserted into the hollow portion 211 of the magnetic core 21. That is, the first terminals 221 of the conductive elements 22 are disposed within the magnetic core 21 but the second terminals 222 of the conductive element 22 are disposed around the outer periphery of the magnetic core 21. Moreover, the first terminals 221 of the conductive elements 22 are partially protruded out of the hollow portion 211 of the magnetic core 21 (see FIG. 5B).

Figure 7:
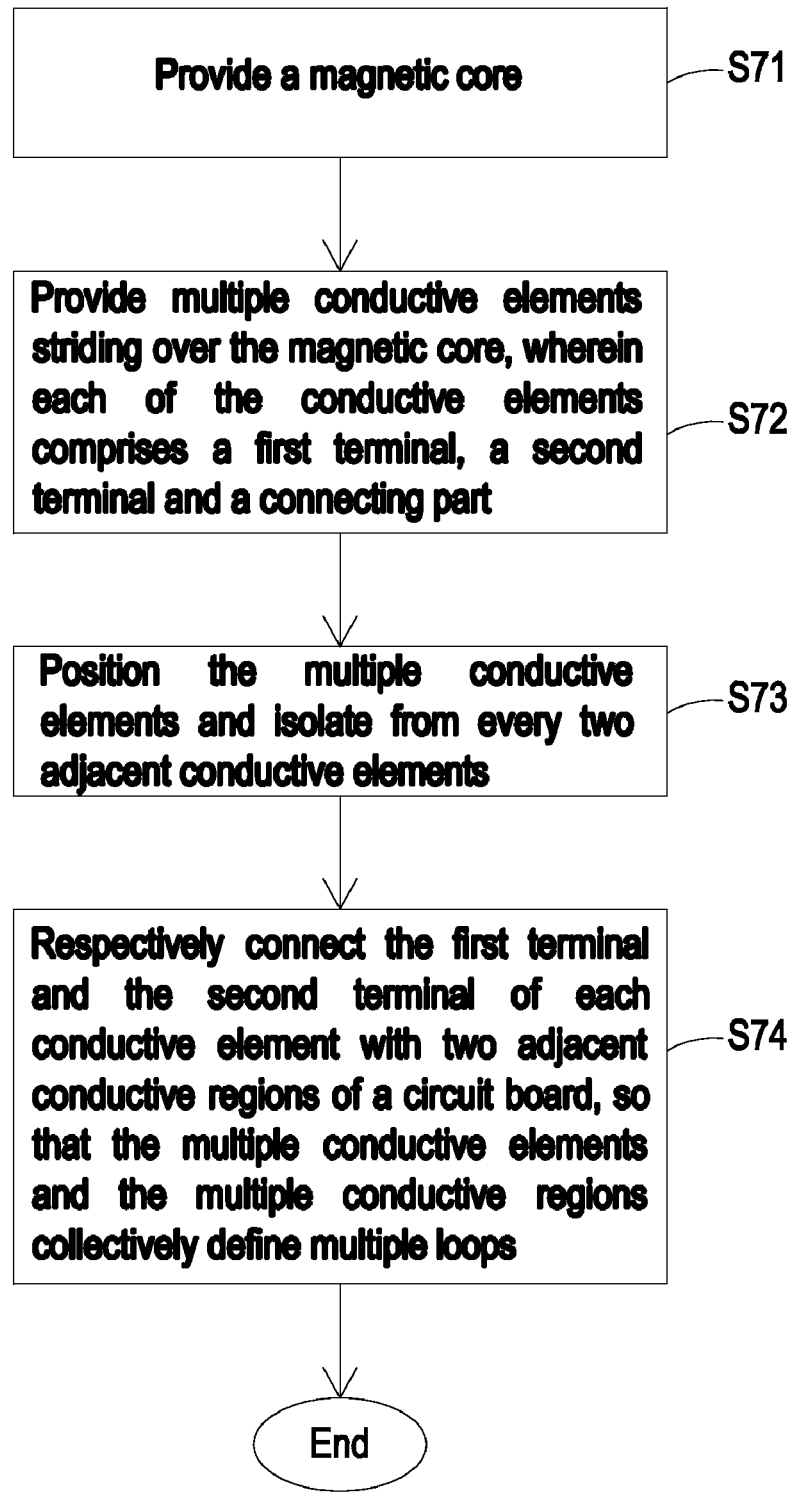
FIG. 7 is a flowchart illustrating a method of fabricating the magnetic assembly of the present invention.

Next, the conductive elements 22 are fixed on the magnetic core 21 by the insulating element 24, wherein every two adjacent conductive elements 22 are isolated by the ribs 243 of the insulating element 24 (see FIGS. 5A, 5B and Step S73 of FIG. 7). Afterwards, the first terminals 221 and the second terminals 222 of the conductive elements 22 are respectively inserted into corresponding perforations 232 and 233 of the circuit board 23 (see FIG. 6B). The first terminal 221 and the second terminal 222 of each conductive element 22 are respectively connected to two adjacent conductive regions 231. As such, the multiple conductive elements 22 and the multiple conductive regions 231 collectively define multiple loops, which interact with the magnetic core 21 to generate inductance (Step S74).

From the above description, the magnetic assembly of the present invention is assembled by striding multiple conductive elements over the magnetic core and connecting the first terminal and the second terminal of each conductive element to two adjacent conductive regions. Since the multiple conductive elements and the multiple conductive regions collectively define multiple loops, the inductance amount is increased. The process of fabricating the magnetic assembly of the present invention is very simple. Moreover, even if the cross-section area of the magnetic core of the magnetic assembly is kept unchanged, the inductance amount of the magnetic assembly could be increased by increasing the thickness of the conductive elements.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetic assembly comprising:
   a magnetic core has a hollow portion;
   an insulating element aligned with said hollow portion of said magnetic core and partially penetrating through said hollow portion of said magnetic core;
   a circuit board comprising multiple conductive regions; and
   multiple conductive elements striding over said magnetic core, wherein each of said conductive elements comprises a first terminal, a second terminal and a connecting part, said connecting part is arranged between said first terminal and said second terminal for connecting said first terminal with said second terminal, said first terminals of said conductive element are inserted into said hollow portion of said magnetic core, and said first terminal and said second terminal of each conductive element are respectively connected to two adjacent conductive regions so that said multiple conductive elements and said multiple conductive regions collectively define multiple loops, and said insulating element is engaged with said first terminals of said conductive elements, thereby facilitating fixing said conductive elements on said magnetic core.

2. The magnetic assembly according to claim 1 wherein said second terminals of said conductive elements are disposed around an outer periphery of said magnetic core.

3. The magnetic assembly according to claim 1 wherein said insulating element comprises a flat slab, a cylindrical body and multiple ribs, said flat slab and said cylindrical body are perpendicular to each other, and said cylindrical body partially penetrates through said hollow portion of said magnetic core, wherein multiple insulating recesses are collectively defined by said flat slab, said cylindrical body and said ribs for accommodating said first terminals and portions of said connecting parts, so that every two adjacent conductive elements are isolated by said ribs of said insulating element.

4. The magnetic assembly according to claim 3 wherein said insulating element further comprises a channel, which runs through said flat slab and said cylindrical body.

5. The magnetic assembly according to claim 1 wherein said circuit board comprises multiple perforations, and said first terminals and said second terminals of said conductive elements are respectively inserted into corresponding perforations.

6. The magnetic assembly according to claim 5 wherein said perforations are formed in said conductive regions of said circuit board.

7. The magnetic assembly according to claim 5 wherein said first terminals and said second terminals of said conductive elements are fixed in corresponding perforations via solder paste, and said first terminals and said second terminals of said conductive elements have respective openings for receiving portions of said solder paste.

8. The magnetic assembly according to claim 1 wherein said conductive elements have shapes mating with said magnetic core.

9. The magnetic assembly according to claim 1 wherein said conductive element is produced by bending a metallic plate.

10. A method of fabricating a magnetic assembly, said method comprising steps of:
    (a) providing a magnetic core, said magnetic core has a hollow portion;
    (b) providing multiple conductive elements striding over said magnetic core, wherein each of said conductive elements comprises a first terminal, a second terminal and a connecting part, and said connecting part is arranged between said first terminal and said second terminal for connecting said first terminal with said second terminal;
    (b1) inserting said first terminals of said conductive element into said hollow portion of said magnetic core;
    (b2) providing an insulating element, so that said conductive elements are positioned on said magnetic core and every two adjacent conductive elements are isolated from each other by said insulating element, and said insulating element is engaged with said first terminals of said conductive elements, thereby facilitating fixing said conductive elements on said magnetic core; and
    (c) respectively connecting said first terminal and said second terminal of each conductive element with two adjacent conductive regions of a circuit board, so that said multiple conductive elements and said multiple conductive regions collectively define multiple loops.

11. The method according to claim 10 wherein said step (b1) further comprises a step of placing said second terminals of said conductive elements around an outer periphery of said magnetic core.

12. The method according to claim 10 wherein said step (c) further comprises a step (c1) of respectively inserting said first terminals and said second terminals of said conductive elements into corresponding perforations of said circuit board.

13. The method according to claim 12 wherein said perforations are formed in said conductive regions of said circuit board.

* * * * *